US011815606B1

(12) United States Patent
Buoniconti et al.

(10) Patent No.: US 11,815,606 B1
(45) Date of Patent: Nov. 14, 2023

(54) LIGHT DETECTION AND RANGING (LIDAR) SYSTEM HAVING A LIQUID COOLED COLD PLATE

(71) Applicant: Aurora Operations, Inc, Mountain View, CA (US)

(72) Inventors: Nicholas Buoniconti, San Francisco, CA (US); Cal Smith, Dublin, CA (US); Thomas Jeffery Watson, Jr., Pittsburgh, PA (US)

(73) Assignee: AURORA OPERATIONS, INC., Mountain View, CA (US)

( * ) Notice: Subject to any disclaimer, the term of this patent is extended or adjusted under 35 U.S.C. 154(b) by 0 days.

(21) Appl. No.: 17/970,735

(22) Filed: Oct. 21, 2022

(51) Int. Cl.
  *G01C 3/08* (2006.01)
  *G01S 17/931* (2020.01)
  *H05K 7/20* (2006.01)
  *G01S 7/481* (2006.01)

(52) U.S. Cl.
  CPC .......... *G01S 17/931* (2020.01); *G01S 7/4813* (2013.01); *H05K 7/20254* (2013.01); *H05K 7/20272* (2013.01)

(58) Field of Classification Search
  None
  See application file for complete search history.

(56) References Cited

U.S. PATENT DOCUMENTS

| | | | |
|---|---|---|---|
| 2017/0261273 A1* | 9/2017 | Maranville | F25B 21/02 |
| 2018/0206358 A1* | 7/2018 | Joist | H05K 7/1442 |
| 2020/0136205 A1* | 4/2020 | Graves | F28F 3/12 |
| 2021/0410328 A1* | 12/2021 | Yang | H05K 7/20254 |
| 2022/0258241 A1* | 8/2022 | Saviers | F28F 3/12 |

FOREIGN PATENT DOCUMENTS

CN 113347805 A * 9/2021 ......... H01L 25/0655

* cited by examiner

*Primary Examiner* — Mark Hellner
(74) *Attorney, Agent, or Firm* — Dority & Manning, P.A.

(57) ABSTRACT

A LIDAR system for a vehicle is provided. The LIDAR system includes a lid defining an internal volume. The LIDAR system includes one or more circuit modules disposed within the internal volume. The LIDAR system includes a cold plate including a first side coupled to the lid to enclose the one or more circuit modules within the internal volume. The cold plate further includes a second side that is different from the first side and defines a fluid channel through which a liquid coolant flows. The LIDAR system includes a cover coupled to the cold plate to cover the fluid channel defined in the second side of the cold plate.

22 Claims, 16 Drawing Sheets

LIGHT DETECTION AND RANGING (LIDAR) SYSTEM HAVING A LIQUID COOLED COLD PLATE

BACKGROUND

LIDAR systems use lasers to create three-dimensional representations of surrounding environments. A LIDAR system includes at least one emitter paired with a receiver to form a channel, though an array of channels may be used to expand the field of view of the LIDAR system. During operation, each channel emits a laser beam into the environment. The laser beam reflects off of an object within the surrounding environment, and the reflected laser beam is detected by the receiver. A single channel provides a single point of ranging information. Collectively, channels are combined to create a point cloud that corresponds to a three-dimensional representation of the surrounding environment.

SUMMARY

Aspects and advantages of embodiments of the present disclosure will be set forth in part in the following description, or may be learned from the description, or may be learned through practice of the embodiments.

Example aspects of the present disclosure are directed to LIDAR systems. As further described herein, the LIDAR systems can be used by various devices and platforms (e.g., robotic platforms, etc.) to improve the ability of the devices and platforms to perceive their environment and perform functions in response thereto (e.g., autonomously navigating through the environment).

A LIDAR system according to example aspects of the present disclosure includes a cold plate having a first side coupled to a lid of the LIDAR system to enclose one or more circuit modules of the LIDAR system within an internal volume defined by the lid. The cold plate further includes a second side that is different from the first side and defines a fluid channel through which a liquid coolant flows to cool the cold plate. The LIDAR system further includes a cover that is coupled to the cold plate to cover the fluid channel. In this manner, the cover helps prevent the liquid coolant from leaking from the fluid channel.

The LIDAR system includes conduits through which the liquid coolant enters the fluid channel and exits the fluid channel. More particularly, the LIDAR system includes a first conduit positioned at an inlet of the fluid channel so that the liquid coolant flowing out of the first conduit enters the fluid channel. The LIDAR system includes a second conduit positioned at an outlet of the fluid channel so that the liquid coolant flowing into the second conduit exits the fluid channel.

The cold plate and the conduits can be formed from a first metal alloy (e.g., heat treatable metal alloy) and the cover can be formed from a second metal alloy (e.g., magnesium free metal alloy or low magnesium content metal alloy) that is different from the first metal alloy. In this manner, the cover can be brazed to the cold plate using a continuous atmospheric brazing process. Additionally, the conduits can simultaneously be brazed to the cover using the continuous atmospheric brazing process.

The LIDAR system can include a sealing member disposed on the first side of the cold plate. The sealing member can engage the lid to form a seal and enclose the one or more circuit modules within the internal volume defined by the lid. Furthermore, since the cold plate is cooler than an ambient environment surrounding the cold plate, condensation can build up on the cold plate. Thus, the LIDAR system can include a desiccant to regulate humidity levels within the internal volume of the lid. More particularly, the desiccant can prevent condensation from forming within the internal volume of the lid. In this manner, the desiccant can prevent condensation from forming on the one or more circuit modules positioned within the internal volume of the lid.

A LIDAR system according to the present disclosure can provide numerous technical effects and benefits. For instance, the liquid cooled cold plate allows the LIDAR system to withstand thermal stresses associated with the extreme environments in which a vehicle and associated sensors and computing hardware need to operate. Furthermore, liquid cooled LIDAR systems according to the present disclosure can have higher power densities compared to conventional air-cooled LIDAR systems. For instance, the disclosed technology (e.g., liquid cooled cold plate) can be especially beneficial to frequency modulated continuous wave (FMCW) LIDAR systems that utilize signal processing techniques (e.g., Fast Fourier transforms) on every iteration of a data scan and therefore require greater amounts of computer processing and therefore generate greater amounts of heat.

In one example aspect of the present disclosure, a LIDAR system for a vehicle is provided. The LIDAR system includes a lid defining an internal volume. The LIDAR system includes one or more circuit modules disposed within the internal volume. The LIDAR system includes a cold plate. The cold plate includes a first side coupled to the lid to enclose the one or more circuit modules within the internal volume. The cold plate includes a second side that is different from the first side and defines a fluid channel through which a liquid coolant flows. The LIDAR system includes a cover coupled to the cold plate to cover the fluid channel.

In some implementations, the cold plate includes a first metal alloy and the cover includes a second metal alloy that is different from the first metal alloy. In some implementations, the first metal alloy includes a heat treatable metal alloy and the second metal alloy includes a magnesium free metal alloy or a low magnesium content metal alloy. In some implementations, the heat treatable metal alloy includes a first aluminum alloy and the magnesium free metal alloy or the low magnesium content metal alloy includes a second aluminum alloy that is different from the first aluminum alloy.

In some implementations, the second side of the cold plate includes a plurality of ribs dividing the fluid channel into at least a first fluid channel and a second fluid channel.

In some implementations, the cover is brazed to the second side of the cold plate. Furthermore, in some implementations, the cover is brazed to a top of at least one of the plurality of ribs of the cold plate.

In some implementations, the plurality of ribs include a first rib having a first thickness and a second rib having a second thickness that is different than the first thickness.

In some implementations, each of the plurality of ribs is at least 10 millimeters thick.

In some implementations, the LIDAR system includes a first conduit and a second conduit. The first conduit is fluidly coupled to an inlet of the fluid channel. The second conduit is fluidly coupled to an outlet of the fluid channel.

In some implementations, at least one of the first conduit or the second conduit is substantially perpendicular to the cover. In alternative implementations, at least one of the first conduit or the second conduit is substantially parallel to the cover.

In some implementations, the fluid channel includes a plurality of turns between the inlet of the fluid channel and the outlet of the fluid channel.

In some implementations, the first conduit and the second conduit are brazed to the cover. In some implementations, the first conduit and the second conduit each include a first metal alloy and the cover includes a second metal alloy that is different from the first metal alloy. In some implementations, the first metal alloy includes a heat treatable metal alloy and the second metal alloy includes a low magnesium content metal alloy.

In some implementations, the cold plate includes a plurality of mounts and each of the mounts is configured to mount the cold plate to a roof of a vehicle.

In some implementations, the LIDAR system includes a sealing member disposed on the first side of the cold plate and configured to engage with the lid to form a seal. In some implementations, the sealing member includes an O-ring.

In some implementations, the one or more circuit modules includes one or more circuit boards and the first side of the cold plate includes one or more recesses for the one or more circuit boards.

In another example aspect of the present disclosure, an autonomous vehicle control system is provided. The autonomous vehicle control system includes a LIDAR system. The LIDAR system includes a lid defining an internal volume. The LIDAR system includes one or more circuit modules disposed within the internal volume. The LIDAR system includes a cold plate. The cold plate includes a first side coupled to the lid to enclose the one or more circuit modules within the internal volume. The cold plate includes a second side that is different from the first side and defines a fluid channel through which a liquid coolant flows. The LIDAR system includes a cover coupled to the cold plate to cover the fluid channel.

In yet another example aspect of the present disclosure, an autonomous vehicle is provided. The autonomous vehicle includes a LIDAR system. The LIDAR system includes a lid defining an internal volume. The LIDAR system includes one or more circuit modules disposed within the internal volume. The LIDAR system includes a cold plate. The cold plate includes a first side coupled to the lid to enclose the one or more circuit modules within the internal volume. The cold plate includes a second side that is different from the first side and defines a fluid channel through which a liquid coolant flows. The LIDAR system includes a cover coupled to the cold plate to cover the fluid channel.

Other example aspects of the present disclosure are directed to other systems, methods, vehicles, apparatuses, tangible non-transitory computer-readable media, and devices for motion prediction and/or operation of a device including a LIDAR system having a liquid cooled cold plate.

These and other features, aspects and advantages of various implementations of the present disclosure will become better understood with reference to the following description and appended claims. The accompanying drawings, which are incorporated in and constitute a part of this specification, illustrate embodiments of the present disclosure and, together with the description, serve to explain the related principles.

DETAILED DESCRIPTION

The following describes the technology of this disclosure within the context of an autonomous vehicle for example purposes only. As described herein, the technology is not limited to an autonomous vehicle and can be implemented within other robotic and computing systems as well as various devices. For example, the systems and methods disclosed herein can be implemented in a variety of ways including, but not limited to, a computer-implemented method, an autonomous vehicle system, an autonomous vehicle control system, a robotic platform system, a general robotic device control system, a computing device, etc.

Figure 1:
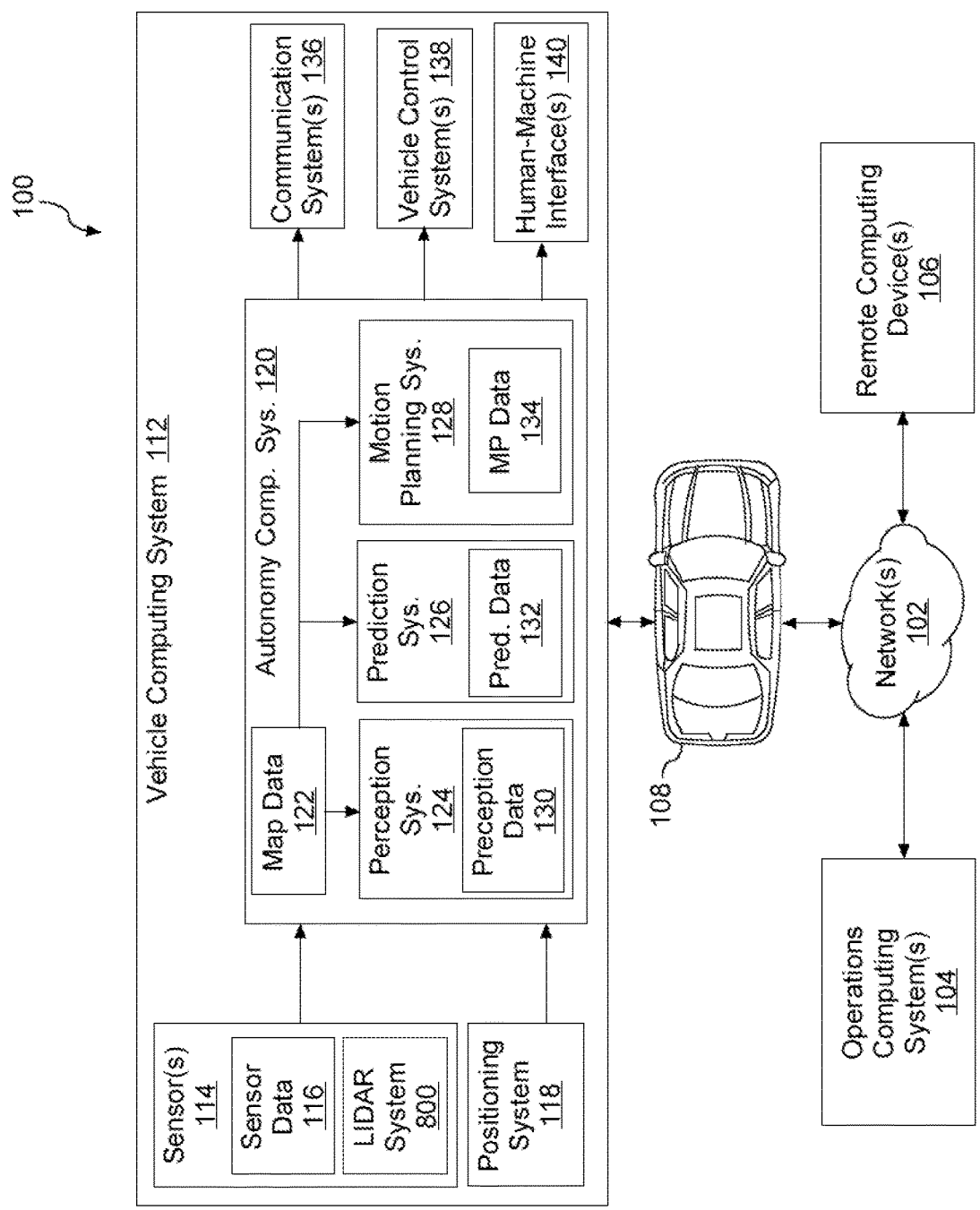
FIG. 1 depicts a block diagram of an example system for controlling the computational functions of an autonomous vehicle according to some implementations of the present disclosure.

Referring now to the figures, FIG. 1 depicts a system 100 that includes a communications network 102; an operations computing system 104; one or more remote computing devices 106; a vehicle 108; a vehicle computing system 112; one or more sensors 114; sensor data 116; a positioning system 118; an autonomy computing system 120; map data 122; a perception system 124; a prediction system 126; a motion planning system 128; perception data 130; prediction data 132; motion plan data 134; a communication system 136; a vehicle control system 138; and a human-machine interface 140.

The operations computing system 104 can be associated with a service provider that can provide one or more vehicle services to a plurality of users via a fleet of vehicles that includes, for example, the vehicle 108. The vehicle services can include transportation services (e.g., rideshare services), courier services, delivery services, and/or other types of services.

The operations computing system 104 can include multiple components for performing various operations and functions. For example, the operations computing system 104 can be configured to monitor and communicate with the vehicle 108 and/or its users to coordinate a vehicle service provided by the vehicle 108. To do so, the operations computing system 104 can communicate with the one or more remote computing devices 106 and/or the vehicle 108 via one or more communications networks including the communications network 102. The communications network 102 can send and/or receive signals (e.g., electronic signals) or data (e.g., data from a computing device) and include any combination of various wired (e.g., twisted pair cable) and/or wireless communication mechanisms (e.g., cellular, wireless, satellite, microwave, and radio frequency) and/or any desired network topology (or topologies). For example, the communications network 102 can include a local area network (e.g. intranet), wide area network (e.g. the Internet), wireless LAN network (e.g., via Wi-Fi), cellular network, a SATCOM network, VHF network, a HF network, a WiMAX based network, and/or any other suitable communications network (or combination thereof) for transmitting data to and/or from the vehicle 108.

Each of the one or more remote computing devices 106 can include one or more processors and one or more memory devices. The one or more memory devices can be used to store instructions that when executed by the one or more processors of the one or more remote computing devices 106 cause the one or more processors to perform operations and/or functions including operations and/or functions associated with the vehicle 108 including sending and/or receiving data or signals to and from the vehicle 108, monitoring the state of the vehicle 108, and/or controlling the vehicle 108. The one or more remote computing devices 106 can communicate (e.g., exchange data and/or signals) with one or more devices including the operations computing system 104 and the vehicle 108 via the communications network 102. For example, the one or more remote computing devices 106 can request the location of the vehicle 108 or a state of one or more objects detected by the one or more sensors 114 of the vehicle 108, via the communications network 102.

The one or more remote computing devices 106 can include one or more computing devices (e.g., a desktop computing device, a laptop computing device, a smart phone, and/or a tablet computing device) that can receive input or instructions from a user or exchange signals or data with an item or other computing device or computing system (e.g., the operations computing system 104). Further, the one or more remote computing devices 106 can be used to determine and/or modify one or more states of the vehicle 108 including a location (e.g., a latitude and longitude), a velocity, an acceleration, a trajectory, a heading, and/or a path of the vehicle 108 based, at least in part, on signals or data exchanged with the vehicle 108. In some implementations, the operations computing system 104 can include the one or more remote computing devices 106.

The vehicle 108 can be a ground-based vehicle (e.g., an automobile, a motorcycle, a train, a tram, a bus, a truck, a tracked vehicle, a light electric vehicle, a moped, a scooter, and/or an electric bicycle), an air-based vehicle (e.g., aircraft, etc.), a water-based vehicle (e.g., a boat, a submersible vehicle, an amphibious vehicle, etc.), a robotic device (e.g. a bipedal, wheeled, or quadrupedal robotic device), and/or any other type of vehicle. The vehicle 108 can be an autonomous vehicle that can perform various actions including driving, navigating, and/or operating, with minimal and/or no interaction from a human driver.

The vehicle 108 can be configured to operate in one or more modes including, for example, a fully autonomous operational mode, a semi-autonomous operational mode, a manual operating mode, a park mode, and/or a sleep mode. A fully autonomous (e.g., self-driving) operational mode can be one in which the vehicle 108 can provide driving and navigational operation with minimal and/or no interaction from a human driver present in the vehicle. A semi-autonomous operational mode can be one in which the vehicle 108 can operate with some interaction from a human driver present in the vehicle. A manual operating mode can be one in which a human driver present in the autonomous vehicle manually controls (e.g., acceleration, braking, steering) the vehicle 108 via one or more vehicle control devices (e.g., steering device) of the vehicle 108. Park and/or sleep modes can be used between operational modes while the vehicle 108 performs various actions including waiting to provide a subsequent vehicle service, and/or recharging between operational modes.

An indication, record, and/or other data indicative of the state of the vehicle 108, the state of one or more passengers of the vehicle 108, and/or the state of an environment external to the vehicle 108 including one or more objects (e.g., the physical dimensions, velocity, acceleration, heading, location, and/or appearance of the one or more objects) can be stored locally in one or more memory devices of the vehicle 108. Furthermore, as discussed above, the vehicle 108 can provide data indicative of the state of the one or more objects (e.g., physical dimensions, velocity, acceleration, heading, location, and/or appearance of the one or more objects) within a predefined distance of the vehicle 108 to the operations computing system 104 and/or the remote computing devices 106, which can store an indication, record, and/or other data indicative of the state of the one or more objects within a predefined distance of the vehicle 108 in one or more memory devices associated with the operations computing system 104 and/or the one or more remote computing devices 106 (e.g., remote from the vehicle).

The vehicle 108 can include and/or be associated with the vehicle computing system 112. The vehicle computing system 112 can represent or include, for example, an autonomous vehicle control system. The vehicle computing system 112 can include one or more computing devices located onboard the vehicle 108. For example, the one or more computing devices of the vehicle computing system 112 can be located on and/or within the vehicle 108. The one or more computing devices of the vehicle computing system 112 can include various components for performing various operations and functions. For instance, the one or more computing devices of the vehicle computing system 112 can include one or more processors and one or more tangible non-transitory, computer readable media (e.g., memory devices). The one or more tangible non-transitory, computer readable media can store instructions that when executed by the one or more processors cause the vehicle 108 (e.g., its computing system, one or more processors, and other devices in the vehicle 108) to perform operations and/or functions, including those described herein for obtaining, processing, and/or otherwise utilizing sensor data collected through the described LIDAR technology, perceiving a surrounding environment, predicting future environmental states, and planning/controlling the motion of the vehicle 108.

As depicted in FIG. 1, the vehicle computing system 112 can include the one or more sensors 114; the positioning system 118; the autonomy computing system 120; the communication system 136; the vehicle control system 138; and the human-machine interface 140. One or more of these systems can be configured to communicate with one another via a communication channel. The communication channel can include one or more data buses (e.g., controller area network (CAN)), on-board diagnostics connector (e.g., OBD-II), and/or a combination of wired and/or wireless communication links. The onboard systems can exchange (e.g., send and/or receive) data, messages, and/or signals amongst one another via the communication channel.

The one or more sensors 114 can be configured to generate and/or store data including the sensor data 116 associated with one or more objects proximate to the vehicle 108 (e.g., within range or a field of view of one or more of the one or more sensors 114). The one or more sensors 114 can include one or more Light Detection and Ranging (LiDAR) systems, one or more Radio Detection and Ranging (RADAR) systems, one or more cameras (e.g., visible spectrum cameras and/or infrared cameras), one or more sonar systems, one or more motion sensors, and/or other types of image capture devices and/or sensors. The sensor data 116 can include image data, radar data, LiDAR data, sonar data, and/or other data acquired by the one or more sensors 114. The one or more objects can include, for example, pedestrians, vehicles, bicycles, buildings, roads, foliage, utility structures, signage, bodies of water, and/or other objects. The one or more objects can be located on or around (e.g., in the area surrounding the vehicle 108) various parts of the vehicle 108 including a front side, rear side, left side, right side, top, or bottom of the vehicle 108. The sensor data 116 can be indicative of a location of the one or more objects within the surrounding environment of the vehicle 108 at one or more times. For example, sensor data 116 can be indicative of one or more LiDAR point clouds associated with the one or more objects within the surrounding environment. The one or more sensors 114 can provide the sensor data 116 to the autonomy computing system 120.

In addition to the sensor data 116, the autonomy computing system 120 can retrieve or otherwise obtain data, including the map data 122. The map data 122 can provide detailed information about the surrounding environment of the vehicle 108. For example, the map data 122 can provide information regarding: the identity and/or location of different roadways, road segments, buildings, or other items or objects (e.g., lampposts, crosswalks and/or curbs); the location and directions of traffic lanes (e.g., the location and direction of a parking lane, a turning lane, a bicycle lane, or other lanes within a particular roadway or other travel way and/or one or more boundary markings associated therewith); traffic control data (e.g., the location and instructions of signage, traffic lights, or other traffic control devices); and/or any other map data that provides information that assists the vehicle computing system 112 in processing, analyzing, and perceiving its surrounding environment and its relationship thereto.

The positioning system 118 can determine a current position of the vehicle 108. The positioning system 118 can be any device or circuitry for analyzing the position of the vehicle 108. For example, the positioning system 118 can determine a position by using one or more of inertial sensors, a satellite positioning system, based on IP/MAC address, by using triangulation and/or proximity to network access points or other network components (e.g., cellular towers and/or Wi-Fi access points) and/or other suitable techniques. The position of the vehicle 108 can be used by various systems of the vehicle computing system 112 and/or provided to one or more remote computing devices (e.g., the operations computing system 104 and/or the remote computing devices 106). For example, the map data 122 can provide the vehicle 108 relative positions of the surrounding environment of the vehicle 108. The vehicle 108 can identify its position within the surrounding environment (e.g., across six axes) based at least in part on the data described herein. For example, the vehicle 108 can process the sensor data 116 (e.g., LiDAR data, camera data) to match it to a map of the surrounding environment to get a determination of the vehicle's position within that environment (e.g., transpose the vehicle's position within its surrounding environment).

The autonomy computing system 120 can include a perception system 124, a prediction system 126, a motion planning system 128, and/or other systems that cooperate to perceive the surrounding environment of the vehicle 108 and determine a motion plan for controlling the motion of the vehicle 108 accordingly. One or more of these systems can be combined into a single system performing the functions thereof and/or share computing resources. For example, the autonomy computing system 120 can receive the sensor data 116 from the one or more sensors 114, attempt to determine the state of the surrounding environment by performing various processing techniques on the sensor data 116 (and/or other data), and generate an appropriate motion plan through the surrounding environment, including for example, a motion plan that navigates the vehicle 108 around the current and/or predicted locations of one or more objects detected by the one or more sensors 114. The autonomy computing system 120 can control the one or more vehicle control systems 138 to operate the vehicle 108 according to the motion plan.

The autonomy computing system 120 can identify one or more objects that are proximate to the vehicle 108 based at least in part on the sensor data 116 and/or the map data 122. For example, the perception system 124 can obtain perception data 130 descriptive of a current and/or past state of an object that is proximate to the vehicle 108. The perception data 130 for each object can describe, for example, an estimate of the object's current and/or past: location and/or position; speed; velocity; acceleration; heading; orientation; size/footprint (e.g., as represented by a bounding shape); class (e.g., pedestrian class vs. vehicle class vs. bicycle class), and/or other state information. The perception system 124 can provide the perception data 130 to the prediction system 126 (e.g., for predicting the movement of an object).

The prediction system 126 can generate prediction data 132 associated with each of the respective one or more objects proximate to the vehicle 108. The prediction data 132 can be indicative of one or more predicted future locations of each respective object. The prediction data 132 can be indicative of a predicted path (e.g., predicted trajectory) of at least one object within the surrounding environment of the vehicle 108. For example, the predicted path (e.g., trajectory) can indicate a path along which the respective object is predicted to travel over time (and/or the velocity at which the object is predicted to travel along the predicted path). The prediction system 126 can provide the prediction data 132 associated with the one or more objects to the motion planning system 128.

In some implementations, the prediction system 126 can utilize one or more machine-learned models. For example, the prediction system 126 can determine prediction data 132 including a predicted trajectory (e.g., a predicted path, one or more predicted future locations, etc.) along which a respective object is predicted to travel over time based on one or more machine-learned models. By way of example, the prediction system 126 can generate such predictions by including, employing, and/or otherwise leveraging a machine-learned prediction model. For example, the prediction system 126 can receive perception data 130 (e.g., from the perception system 124) associated with one or more objects within the surrounding environment of the vehicle 108. The prediction system 126 can input the perception data 130 (e.g., BEV image, LIDAR data, etc.) into the machine-learned prediction model to determine trajectories of the one or more objects based on the perception data 130 associated with each object. For example, the machine-learned prediction model can be previously trained to output a future trajectory (e.g., a future path, one or more future geographic locations, etc.) of an object within a surrounding environment of the vehicle 108. In this manner, the prediction system 126 can determine the future trajectory of the object within the surrounding environment of the vehicle 108 based, at least in part, on the machine-learned prediction generator model.

The motion planning system 128 can determine a motion plan and generate motion plan data 134 for the vehicle 108 based at least in part on the prediction data 132 (and/or other data). The motion plan data 134 can include vehicle actions with respect to the objects proximate to the vehicle 108 as well as the predicted movements. For instance, the motion planning system 128 can implement an optimization algorithm that considers cost data associated with a vehicle action as well as other objective functions (e.g., cost functions based on speed limits, traffic lights, and/or other aspects of the environment), if any, to determine optimized variables that make up the motion plan data 134. By way of example, the motion planning system 128 can determine that the vehicle 108 can perform a certain action (e.g., pass an object) without increasing the potential risk to the vehicle 108 and/or violating any traffic laws (e.g., speed limits, lane boundaries, signage). The motion plan data 134 can include a planned trajectory, velocity, acceleration, and/or other actions of the vehicle 108.

The motion planning system 128 can provide the motion plan data 134 with data indicative of the vehicle actions, a planned trajectory, and/or other operating parameters to the vehicle control systems 138 to implement the motion plan data 134 for the vehicle 108. For instance, the vehicle 108 can include a mobility controller configured to translate the motion plan data 134 into instructions. In some implementations, the mobility controller can translate determined motion plan data 134 into instructions for controlling the vehicle 108 including adjusting the steering of the vehicle 108 "X" degrees and/or applying a certain magnitude of braking force. The mobility controller can send one or more control signals to the responsible vehicle control component (e.g., braking control system, steering control system and/or acceleration control system) to execute the instructions and implement the motion plan data 134.

The vehicle computing system 112 can include a communications system 136 configured to allow the vehicle computing system 112 (and its one or more computing devices) to communicate with other computing devices. The vehicle computing system 112 can use the communications system 136 to communicate with the operations computing system 104 and/or one or more other remote computing devices (e.g., the one or more remote computing devices 106) over one or more networks (e.g., via one or more wireless signal connections). In some implementations, the communications system 136 can allow communication among one or more of the system on-board the vehicle 108. The communications system 136 can also be configured to enable the autonomous vehicle to communicate with and/or provide and/or receive data and/or signals from a remote computing device 106 associated with a user and/or an item (e.g., an item to be picked-up for a courier service). The communications system 136 can utilize various communication technologies including, for example, radio frequency signaling and/or Bluetooth low energy protocol. The communications system 136 can include any suitable components for interfacing with one or more networks, including, for example, one or more: transmitters, receivers, ports, controllers, antennas, and/or other suitable components that can help facilitate communication. In some implementations, the communications system 136 can include a plurality of components (e.g., antennas, transmitters, and/or receivers) that allow it to implement and utilize multiple-input, multiple-output (MIMO) technology and communication techniques.

The vehicle computing system 112 can include the one or more human-machine interfaces 140. For example, the vehicle computing system 112 can include one or more display devices located on the vehicle computing system 112. A display device (e.g., screen of a tablet, laptop and/or smartphone) can be viewable by a user of the vehicle 108 that is located in the front of the vehicle 108 (e.g., driver's seat, front passenger seat). Additionally, or alternatively, a display device can be viewable by a user of the vehicle 108 that is located in the rear of the vehicle 108 (e.g., a back passenger seat). For example, the autonomy computing system 120 can provide one or more outputs including a graphical display of the location of the vehicle 108 on a map of a geographical area within a certain distance (e.g., one kilometer, etc.) of the vehicle 108 including the locations of objects around the vehicle 108. A passenger of the vehicle 108 can interact with the one or more human-machine interfaces 140 by touching a touchscreen display device associated with the one or more human-machine interfaces.

In some implementations, the vehicle computing system 112 can perform one or more operations including activating, based at least in part on one or more signals or data (e.g., the sensor data 116, the map data 122, the perception data 130, the prediction data 132, and/or the motion plan data 134) one or more vehicle systems associated with operation of the vehicle 108. For example, the vehicle computing system 112 can send one or more control signals to activate one or more vehicle systems that can be used to control and/or direct the travel path of the vehicle 108 through an environment.

By way of further example, the vehicle computing system 112 can activate one or more vehicle systems including: the communications system 136 that can send and/or receive signals and/or data with other vehicle systems, other vehicles, or remote computing devices (e.g., remote server devices); one or more lighting systems (e.g., one or more headlights, hazard lights, and/or vehicle compartment lights); one or more vehicle safety systems (e.g., one or more seatbelt and/or airbag systems); one or more notification systems that can generate one or more notifications for passengers of the vehicle 108 (e.g., auditory and/or visual messages about the state or predicted state of objects external to the vehicle 108); braking systems; propulsion systems that can be used to change the acceleration and/or velocity of the vehicle which can include one or more vehicle motor or engine systems (e.g., an engine and/or motor used by the vehicle 108 for locomotion); and/or steering systems that can change the path, course, and/or direction of travel of the vehicle 108.

Figure 2:
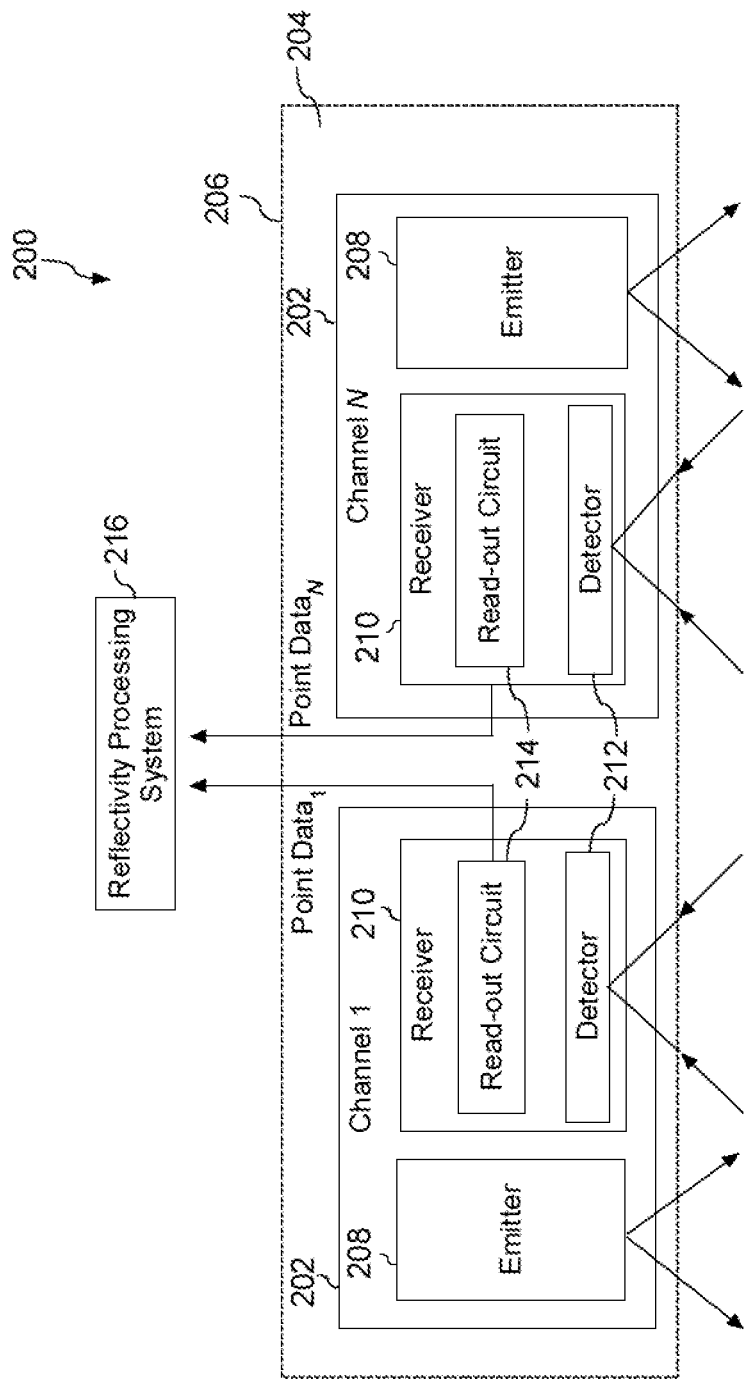
FIG. 2 depicts a block diagram of a LIDAR system according to some implementations of the present disclosure.
Figure 3:
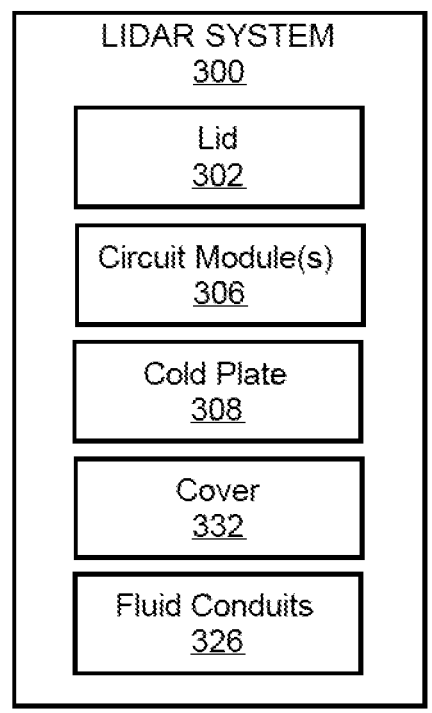
FIG. 3 depicts a block diagram of components of a LIDAR system having a cold plate according to some implementations of the present disclosure.
Figure 4:
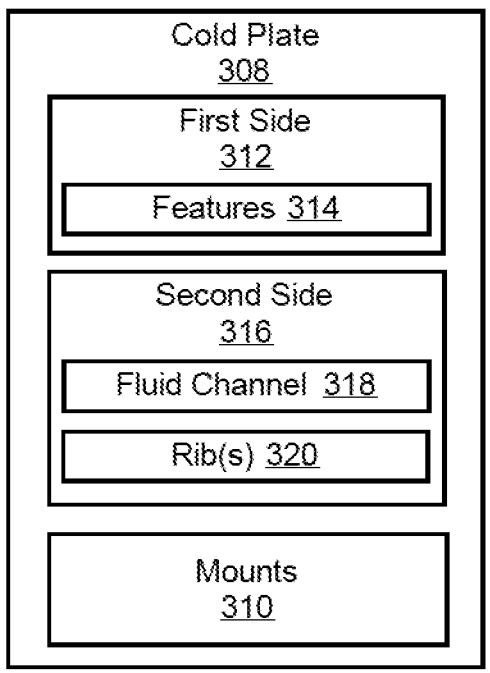
FIG. 4 depicts components of a cold plate of a LIDAR system according to some implementations of the present disclosure.

Referring now to FIG. 2, a block diagram of components of a LIDAR system 200 is provided according to some implementations of the present disclosure. It should be understood that the LIDAR system 200 can be included as part of the sensors 114 discussed above with reference to FIG. 1. As shown, the LIDAR system 200 can include multiple channels 202; specifically, channels 1-N are illustrated. In some implementations, channels 1-N can be included within an internal volume 204 defined by a single housing 206. In alternative implementations, channels 1-N may be spread across multiple housings 206. Each channel 202 can output point data that provides a single point of ranging information. The point data output by each of the channels 202 (e.g., point data$_{1-N}$) can be combined to create a point cloud that corresponds to a three-dimensional representation of the surrounding environment.

In some implementations, each channel 202 can include an emitter 208 paired with a receiver 210. The emitter 208 emits a light signal into the environment that is reflected off the surrounding environment and returned back to a detector 212 (e.g., an optical detector) of the receiver 210. Each emitter 208 can have an adjustable power level that controls an intensity of the emitted laser signal. The adjustable power level allows the emitter 208 to be capable of emitting the laser signal at one of multiple different power levels (e.g., intensities).

In some implementations, the LIDAR system 200 can be implemented as a time-of-flight LIDAR system. In such implementations, the detector 212 can provide the return signal to a read-out circuit 214 and the read-out circuit 214 can, in turn, output the point data based on the return signal. The point data can indicate a distance the LIDAR system 200 is from a detected object (e.g., road, pedestrian, vehicle, etc.) that is determined by the read-out circuit 214 by measuring time-of-flight (ToF), which is the time elapsed time between the emitter 208 emitting the laser signal (e.g., laser beam) and the receiver 210 detecting the return signal (e.g., reflected laser beam).

The point data further includes an intensity value corresponding to each return signal. The intensity value indicates a measure of intensity of the return signal determined by the read-out circuit 214. As noted above, the intensity of the return signal provides information about the surface reflecting the signal and can be used by the autonomy computing system 120 (FIG. 1) for localization, perception, prediction, and/or motion planning. The intensity of the return signals depends on a number of factors, such as the distance of the LIDAR system 200 to the detected object, the angle of incidence at which the emitter 208 emits the laser signal, temperature of the surrounding environment, the alignment of the emitter 208 and the receiver 210, and the reflectivity of the detected surface.

As shown, a reflectivity processing system 216 receives the point data from the LIDAR system 800 and processes the point data to classify specular reflectivity characteristics of objects. The reflectivity processing system 216 classifies the specular reflectivity characteristics of objects based on a comparison of reflectivity values derived from intensity values of return signals. In some embodiments, the LIDAR system 200 can be calibrated to produce the reflectivity values. For example, the read-out circuit 214 or another component of the LIDAR system 200 can be configured to normalize the intensity values to produce the reflectivity values. In these embodiments, the reflectivity values may be included in the point data received by the reflectivity processing system 216 from the LIDAR system 200. In other embodiments, the reflectivity processing system 216 may generate the reflectivity values based on intensity return values included in the point data received from the LIDAR system 200.

Regardless of which component is responsible for generating the reflectivity values, the process for doing so may, in some embodiments, include using a linear model to compute one or more calibration multipliers and one or more bias values to be applied to return intensity values. Depending on the embodiment, a calibration multiplier and bias value may be computed for and applied to each channel of the LIDAR system 200 at each power level. The linear model assumes a uniform diffuse reflectivity for all surfaces and describes an expected intensity value as a function of a raw intensity variable, a calibration multiplier variable, and/or a bias variable. The computing of the calibration multiplier and bias value for each channel/power level combination includes determining a median intensity value based on the raw intensity values output by the channel at the power level and using the median intensity value as the expected intensity value in the linear model while optimizing values for the calibration multiplier variable and bias variable. As an example, the calibration multiplier and bias value may be computed by solving the linear model using an Iterated Re-weighted Least Squares approach.

The calibration multiplier and bias value computed for each channel 202 at each power level can be assigned to the corresponding channel/power level combination. In this way, each power level of each channel of the LIDAR system 200 can have an independently assigned calibration multiplier and bias value from which reflectivity values may be derived. Once assigned, the calibration multiplier and bias value of each channel/power level combination can be used at run-time to determine reflectivity values from subsequent intensity values produced by the corresponding channel at the corresponding power level during operation of an autonomous or semi-autonomous vehicle. More specifically, reflectivity values can be determined from the linear model by using the value of the calibration multiplier and the bias value for the calibration multiplier variable and bias variable, respectively. In this manner, the intensity values can be normalized to be more aligned with the reflectivity of a surface by taking into account factors such as the distance of the LIDAR system 200 to the detected surface, the angle of incidence at which the emitter 208 emits the laser signal, temperature of the surrounding environment, and/or the alignment of the emitter 208 and the receiver 210.

In some implementations, the LIDAR system 200 can be implemented as a frequency modulated continuous wave (FMCW) LIDAR system that uses frequency modulation to encode an optical signal emitted from each of the emitters 208 and scatter the encoded optical signals into free-space using optics. By detecting the frequency differences between the encoded optical signal and a returned signal reflected back from an object, FMCW LIDAR systems can determine the location of the object and/or precisely measure the velocity of the object using the Doppler effect.

FMCW LIDAR systems can provide accurate velocity for each data point instantaneously. In some implementations, a velocity measurement is accomplished using the Doppler effect which shifts frequency of the light received from the object based at least one of the velocity in the radial direction (e.g., the direction vector between the object detected and the sensor) or the frequency of the laser signal. For example, for velocities encountered in on-road situations where the velocity is less than 100 meters per second (m/s), this shift at a wavelength of 1550 nanometers (=m) amounts to the frequency shift that is less than 130 megahertz (MHz). This frequency shift is small such that it is difficult to detect directly in the optical domain. However, by using coherent detection in FMCW LIDAR systems, the signal can be converted to the RF domain such that the frequency shift can be calculated using various signal processing techniques (e g Fast Fourier Transforms). This enables the autonomous vehicle control system to process incoming data faster.

However, these signal processing techniques (e.g., Fast Fourier Transforms) can necessitate increased computer processing compared to conventional time-of-flight based LIDAR systems. Therefore, heat associated with computer processing can be greater for FMCW LIDAR systems than compared to conventional time-of-flight based LIDAR systems. As will now be discussed, LIDAR systems (e.g., time-of-flight based LIDAR systems and FMCW LIDAR systems) according to implementations of the present disclosure can include a liquid cooled cold plate to provide improved cooling for the LIDAR systems.

Referring now to FIGS. 3 through 6, a LIDAR system 300 is provided according to some implementations of the present disclosure. In some implementations, the LIDAR system 300 can be implemented as a FMCW LIDAR system. In alternative implementations, the LIDAR system 300 can be implemented as a time-of-flight based LIDAR system. As shown, the LIDAR system 300 can include a lid 302 defining an internal volume 304. The LIDAR system 300 can include one or more circuit modules 306 positioned within the internal volume 304 of the lid 302. It should be understood that the one or more circuit modules 306 can include electronic components (e.g., optics, field programmable gate arrays (FPGAs), optical amplifiers, microprocessors, etc.) of the LIDAR system 300. In some implementations, the one or more circuit modules 306 can be implemented as an integrated circuit (e.g., a chip). In alternative implementations, the one or more circuit modules 306 can be implemented as one or more printed circuit boards.

The LIDAR system 300 can include a cold plate 308 that can be removably coupled to the lid 302. For instance, in some implementations, the cold plate 308 can be coupled to the lid 302 using one or more fasteners (e.g., screws). It should be understood, however, that the cold plate 308 can be coupled to the lid 302 in any suitable manner. When the cold plate 308 is coupled to the lid 302, the cold plate 308 can enclose the one or more circuit modules 306 within the internal volume 304 defined by the lid 302. Furthermore, the cold plate 308 can include one or more mounts 310. The one or more mounts 310 can be configured to attach the cold plate 308 to a vehicle, such as the vehicle 108 described above with reference to FIG. 1. More particularly, the cold plate 308 can be attached to a roof of the vehicle 108.

The cold plate 308 can include a first side 312 to which the one or more circuit modules 306 of the LIDAR system 300 can be mounted. For instance, the first side 312 of the cold plate 308 can include one or more features 314 for attaching the one or more circuit modules 306 thereto. In some implementations, the one or more features 314 can include one or more recesses defined in the first side 312 of the cold plate 308. Alternatively, or additionally, the one or more features 314 can include one or more bosses included on the first side 312 of the cold plate 308. It should be understood that the one or more bosses can be configured to accept a fastener (e.g., screw, bolt, etc.) needed to fasten the one or more circuit modules 306 to the first side 312 of the cold plate 308.

The cold plate 308 can include a second side 316 that is different from (e.g., opposite) the first side 312 of the cold plate 308. The second side 316 of the cold plate 308 can define a fluid channel 318 that extends along at least a portion of the second side 316. For instance, the fluid channel 318 can extend along portions of the second side 316 that are opposite portions of the first side 312 to which the one or more circuit modules 306 are attached. In some implementations, the fluid channel 318 can include one or more turns or bends between an inlet region of the fluid channel 318 and an outlet region of the fluid channel 318. For instance, the one or more turns or bends can be positioned at a location on the second side 316 of the cold plate 308 that corresponds (e.g., is opposite) to a location on the first side 312 of the cold plate 308 to which the one or more circuit modules 306 are mounted.

The second side 316 can further include one or more ribs 320 positioned within the fluid channel 318. A liquid coolant 322 can flow through the fluid channel 318 defined in the second side 316 of the cold plate 308. As the liquid coolant 322 flows through the fluid channel 318, heat can be transferred from cold plate 308 to the liquid coolant 322. More particularly, heat can be transferred from the one or more ribs 320 to the liquid coolant 322. In this manner, the one or more ribs 320 can act as a heat exchanger to transfer heat from the cold plate 308 to the liquid coolant 322. Furthermore, the one or more ribs 320 can provide structural support for the cold plate 308.

It should be understood that the liquid coolant 322 can be provided from a liquid coolant source 324. In some implementations, the liquid coolant source 324 can be part of the vehicle 108 (FIG. 1) to which the cold plate 308 is mounted. In such implementations, the liquid coolant 322 can be an automotive grade coolant. For example, the automotive grade coolant can include a mixture of ethylene glycol and water. In alternative implementations, the liquid coolant source 324 can be part of the LIDAR system 300. Stated another way, the LIDAR system 300 can include its own liquid coolant source that is separate from the liquid coolant source 324 for the vehicle. It should be understood that the liquid coolant 322 is not limited to automotive grade coolants. For instance, in some implementations, the liquid coolant 322 could include water. It should also be appreciated that, in some implementations, compressed gas could be used instead of the liquid coolant 322.

The LIDAR system 300 can include conduits 326 through which the liquid coolant 322 enters the fluid channel 318 and exits the fluid channel 318. For instance, the LIDAR system 300 can include a first conduit 328 positioned at an inlet region of the fluid channel 318. In this manner, the liquid coolant 322 can flow out of the first conduit 328 and into the fluid channel 318. Additionally, the LIDAR system 300 can include a second conduit 330 positioned at an outlet region of the fluid channel 318. In this manner, the liquid coolant 322 can flow into the second conduit 330 to exit the fluid channel 318.

The LIDAR system 300 can include a cover 332 that is coupled to the cold plate 308. More particularly, the cover 332 can be coupled to the second side 316 of the cold plate 308 to cover the fluid channel 318. In this manner, the cover 332 can contain (e.g., prevent leakage of) the liquid coolant 322 within the fluid channel 318.

In some implementations, the cover 332 can be brazed to the cold plate 308. For instance, the cover 332 can be brazed to the second side 316 of the cold plate 308. As used herein, the term "brazed" refers to a process in which two metals are joined using a filler material (e.g., braze) that is activated at a temperature of greater than a threshold temperature (e.g., 840° F.). Furthermore, the process can include a first process referred to as continuous atmospheric brazing and a second process referred to as vacuum brazing. For both the continuous atmospheric brazing and the vacuum brazing, the two metals being joined using the filler material are passed through a furnace that heats the filler material to the temperature needed to activate the filler material and join the two components together. However, vacuum brazing requires the furnace be held under a vacuum, whereas continuous active brazing does not require the furnace be held under a vacuum. As will be discussed below, the type of process (e.g., continuous atmospheric brazing or vacuum brazing) used to braze two metals depends on the type of metals.

In some implementations, the cold plate 308 and the cover 332 can both be formed from a heat treatable metal alloy. As used herein, a heat treatable metal alloy refers to a metal alloy that can be reheated after undergoing the brazing process. In some implementations, the heat treatable metal alloy can be 6063 aluminum. In implementations in which the cold plate 308 and the cover 332 are both formed from the heat treatable metal alloy, the vacuum brazing process must be used to braze the cover 332 to the cold plate 308. It should be understood that the vacuum brazing process is less desirable (e.g., more costly) than the continuous atmospheric brazing process for large high volume applications.

In some implementations, the cold plate 308 and the cover 332 can be formed from a magnesium free metal alloy or a low magnesium content metal alloy. As used herein, a low magnesium content metal alloy can include metal alloys that are less than 0.4% by weight magnesium. Examples of a magnesium free metal alloy can include, without limitation, 3000 series aluminum. Examples of a low magnesium content metal alloy can include, without limitation, 1000 series aluminum.

It should be understood that 3003 aluminum is not as strong (e.g., lower tensile strength) as 6063 aluminum. Therefore, a component (e.g., cold plate 308) formed from 3003 aluminum must be thicker than the same component formed from 6063 aluminum in order to provide the same structural performance. As an example, 3003 aluminum can be about 30% as strong as 6063 aluminum and would therefore need to be at least 3 times stiffer than 6063 aluminum to provide comparable strength. Thus, a component formed from the 3003 aluminum would need to be about 1.5 times thicker than the same component formed from 6063 aluminum in order to be at least 3 times stiffer than the same component formed from 6063 aluminum. Accordingly, the component formed from 3003 aluminum component would be heavier (e.g., weigh more) than the component formed from 6063 aluminum.

In some implementations, the cold plate 308 and the cover 332 can be formed from different metal alloys. For instance, the cold plate 308 can be formed from the heat treatable metal alloy (e.g., 6063 aluminum) and the cover 332 can be formed from the magnesium free metal alloy (e.g., 3003 aluminum) or the low-magnesium content metal alloy (e.g., 1000 series aluminum). In implementations in which the cold plate 308 is formed from the heat treatable metal alloy and the cover 332 is formed from the magnesium free metal alloy or the low-magnesium content metal alloy, the continuous atmospheric brazing process can be used to braze the cover 332 to the cold plate 308. Furthermore, since the cold plate 308 is formed from the heat treatable metal alloy, the brazing joint between the cold plate 308 and the cover 332 can be improved and therefore leakage of the liquid coolant 322 at the brazing joint between the cold plate 308 and the cover 332 can be prevented. Additionally, since heat treatable metal alloys are stronger (e.g., have a higher tensile strength) compared to magnesium free metal alloys and low magnesium content metal alloys, the cold plate 308 can be lighter (e.g., weigh less) than cold plates formed exclusively from magnesium free metal alloys or low magnesium content metal alloys and can still provide the same or better structural performance than the cold plates formed exclusively from magnesium free metal alloys or low magnesium content metal alloys. Thus, forming the cold plate 308 from the heat treatable metal alloy can be desirable when the LIDAR system 300 is used in applications (e.g., automotive) where mass savings are desirable. Furthermore, the material selection can impact the design of the cold plate 308. For instance, the 3003 aluminum may not be strong enough for threaded features that are possible with the 6063 aluminum. Thus, the cold plate 308 that is formed using the 3003 aluminum would need to include inserts instead, which can complicate the design of the cold plate 308.

In addition to brazing the cover 332 to the cold plate 308, the conduits 326 can be brazed to the cover 332. For instance, in some implementations, the first conduit 328 and the second conduit 330 can each be formed from the heat treatable metal alloy (e.g., 6063 aluminum) and the cover 332 can be formed from the magnesium free metal alloy (e.g., 3000 series aluminum) or the low magnesium content metal alloy (e.g., 1000 series aluminum). In such implementations, the continuous atmospheric brazing process can be used to braze the first conduit 328 and the second conduit 330 to the cover 332. Furthermore, since the conduits 326 are formed from the heat treatable metal alloy, the brazing joint between the cover 332 and the conduits 326 can be improved and therefore leakage of the liquid coolant 322 at the brazing joint between the cover 332 and the conduits 326 can be prevented. Additionally, since heat treatable alloys are generally resistant to corrosion, forming the conduits 326 from a heat treatable metal alloy can be especially important when the LIDAR system 300 is used in automotive applications and is therefore subject to extreme environmental conditions.

Referring now to FIGS. 7 through 13, the LIDAR system 300 is provided according to some implementations of the present disclosure. As shown, the lid 302 can include a transparent portion 402 through which electronic components 404 of the LIDAR system 300 in the internal volume 304 of the lid 302 are visible. Furthermore, the cold plate 308 can be secured to the lid 302 through a plurality of fasteners 406. For instance, each of the fasteners 406 can extend through an aperture (not shown) defined by the cold plate 308 and extending therethrough to attach the cold plate 308 to the lid 302.

In some implementations, the second side 316 of the cold plate 308 can include a first rib 408, a second rib 410, and a third rib 412. In alternative implementations, the second side 316 of the cold plate 308 can include more or fewer ribs. As shown, each of the first rib 408, the second rib 410, and the third rib 412 can be positioned within the fluid channel 318. In some implementations, the first rib 408, the second rib 410, and the third rib 412 can each extend along the fluid channel 318 between an inlet region 414 of the fluid channel 318 and an outlet region 416 of the fluid channel 318. It should be understood that the inlet region 414 and the outlet region 416 of the fluid channel 318 refer to end portions of the fluid channel 318 that do not include the ribs 408, 410, 412.

As shown, the ribs 408, 410, 412 can divide the fluid channel 318 into a first fluid channel 418, a second fluid channel 420, a third fluid channel 422, and a fourth fluid channel 424. Furthermore, in some implementations, the thickness T of each rib 408, 410, 412 can vary. For instance, in some implementations, the second rib 410 (e.g., middle rib) can be thicker than the first rib 408 and the third rib 412.

In some implementations, the thickness T can vary depending on a length of the ribs 408, 410, 412. For instance, in some implementations, the second rib 410 can be longer than each of the first rib 408 and the third rib 412. In such implementations, the second rib 410 can be thicker than each of the first rib 408 and the third rib 412 due, at least in part, to the second rib 410 being longer than each of the first rib 408 and the third rib 412.

Figure 11:
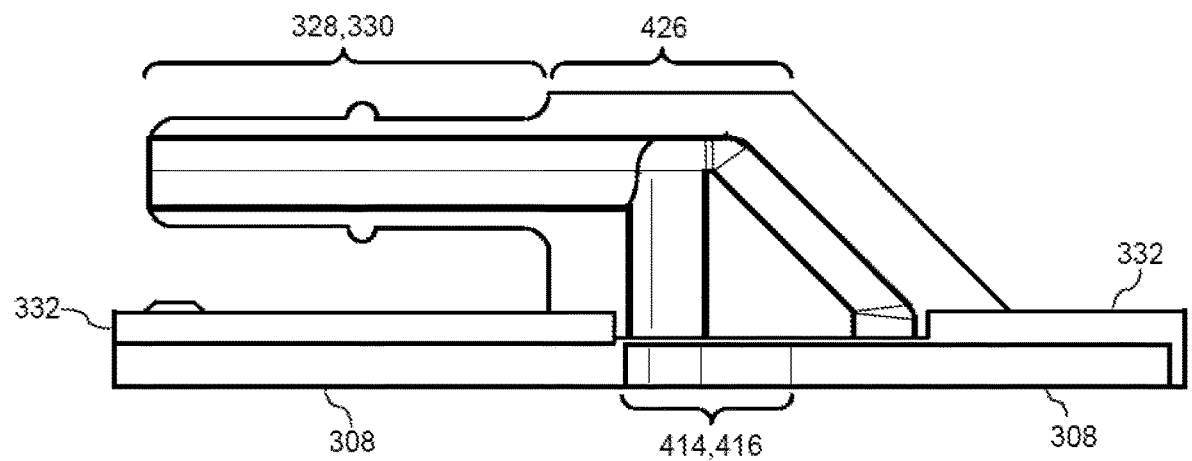
FIG. 11 depicts a side view of a conduit of the LIDAR system of FIG. 7 according to some implementations of the present disclosure.

As shown in FIG. 11, the first conduit 328 and the second conduit 330 can each be parallel to the cover 332. For instance, in some implementations, the first conduit 328 and the second conduit 330 can include a 90-degree fitting. It should be understood that the LIDAR system 300 includes an interface 426 to facilitate brazing the first conduit 328 and the second conduit 330, respectively, to the cover 332. In some implementations, the interface 426 can be formed from the same material (e.g., metal alloy) as the respective conduit 328, 330.

Figure 12:
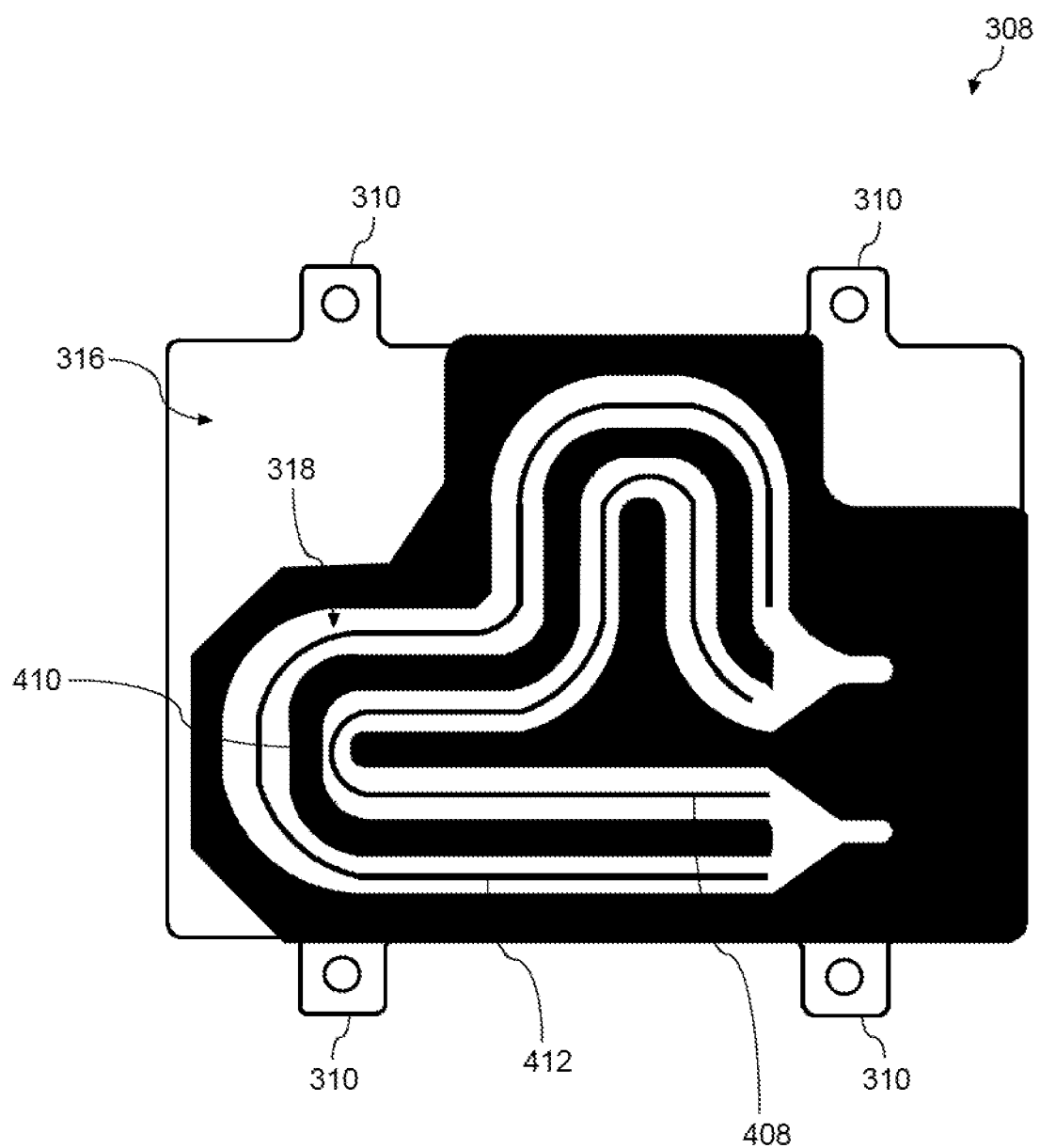
FIG. 12 depicts portions of a second side of a cold plate of the LIDAR system of FIG. 7 to which a cover of the LIDAR system is brazed according to some implementations of the present disclosure.

As shown in FIG. 12, a brazing surface (denoted in black) of the second side 316 of the cold plate 308 can include portions of the second side that surround a periphery of the fluid channel 318. Furthermore, in some implementations, the brazing surface of the second side 316 of the cold plate 308 can include a top of one or more of the ribs 408, 410, 412 disposed within the fluid channel 318. For instance, the brazing surface can include a top of the second rib 410. Brazing the cover 332 to the second side 316 of the cold plate 308 can be preferred over other techniques (e.g., welding) for coupling the cover 332 to the second side 316 of the cold plate 308. For instance, brazing the cover 332 to the top of one or more of the ribs 408, 410, 412 on the second side 316 of the cold plate 308 is easier compared to welding the cover 332 to the top of one or more of the ribs 408, 410, 412. More particularly, holes would need to be drilled in the cover 332 at locations corresponding to the ribs 408, 410, 412 and the holes would need to filled with welding material to form a weld joint between the cover 332 and the ribs 408, 410, 412. It should be understood that holes would not need to be drilled in the cover 332 to braze the cover 332 to one or more of the ribs 408, 410, 412. Furthermore, drilling and welding holes in the cover 332 can create stresses in the cover 332 and, in some instances, can negatively affect the structural integrity of the cover 332.

Figure 13:
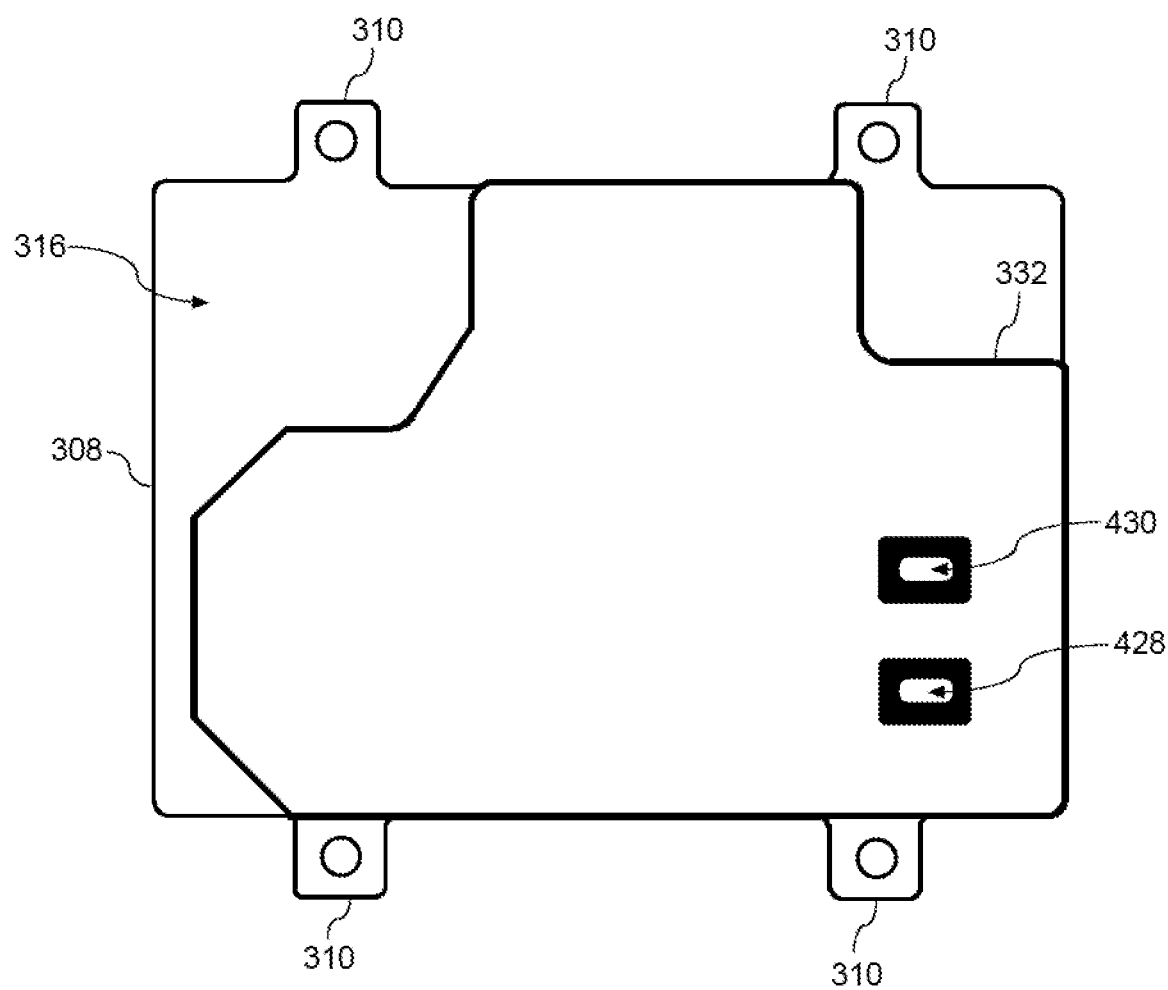
FIG. 13 depicts portions of a cover of the LIDAR system of FIG. 7 to which conduits of the LIDAR system are brazed according to some implementations of the present disclosure.

As shown in FIG. 13, a brazing surface (denoted in black) of the cover 332 includes a portion surrounding a first aperture 428 defined by the cover 332 and a second aperture 430 defined by the cover 332. It should be understood that the first aperture 428 can be located at an inlet region 414 (FIG. 8) of the fluid channel 318 (FIG. 8) when the cover 332 is brazed to the cold plate 308. It should also be understood that the second aperture 430 can be located at an outlet region 416 (FIG. 8) of the fluid channel (FIG. 8) when the cover 332 is brazed to the cold plate 308.

Figure 14:
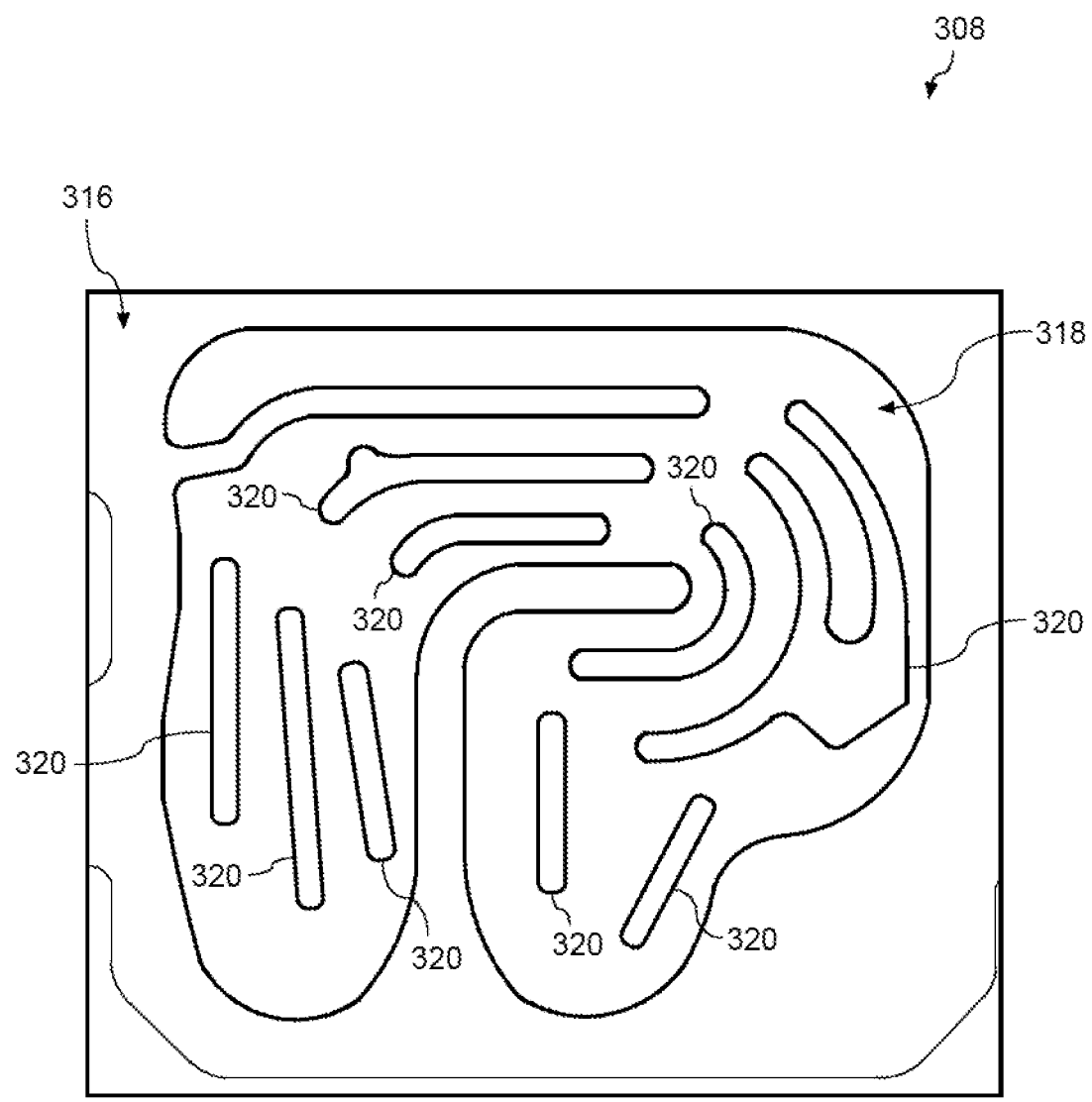
FIG. 14 depicts a fluid channel in a second side of a cold plate of a LIDAR system according to some implementations of the present disclosure.

Referring now to FIG. 14, the second side 316 of the cold plate 308 is provided according to some implementations of the present disclosure. As shown, the ribs 320 disposed within the fluid channel 318 can have varying shapes and lengths. Furthermore, some of the ribs 320 in the fluid channel 318 can be thicker than other ribs 320 in the fluid channel 318. It should be understood that the ribs 320 can be arranged within the fluid channel 318.

Figure 15:
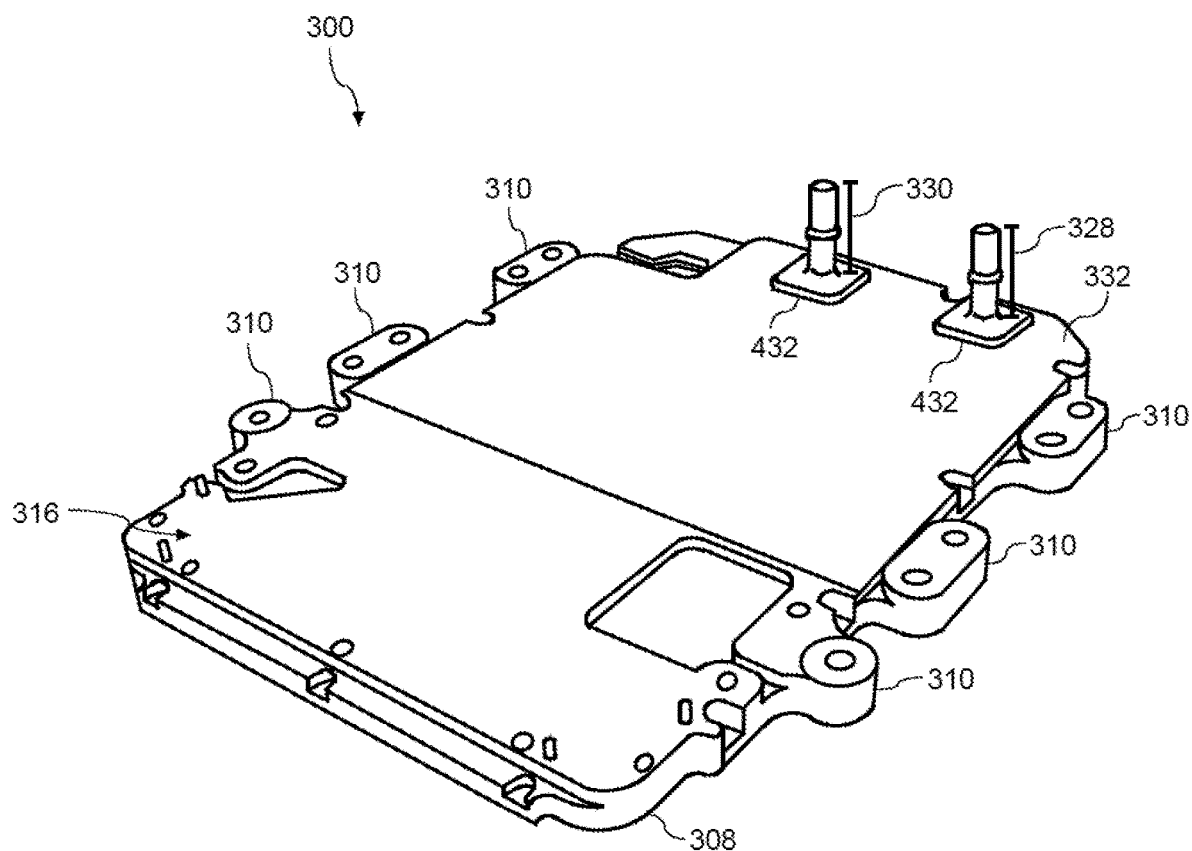
FIG. 15 depicts a cold plate of a LIDAR system according to some implementations of the present disclosure.
Figure 16:
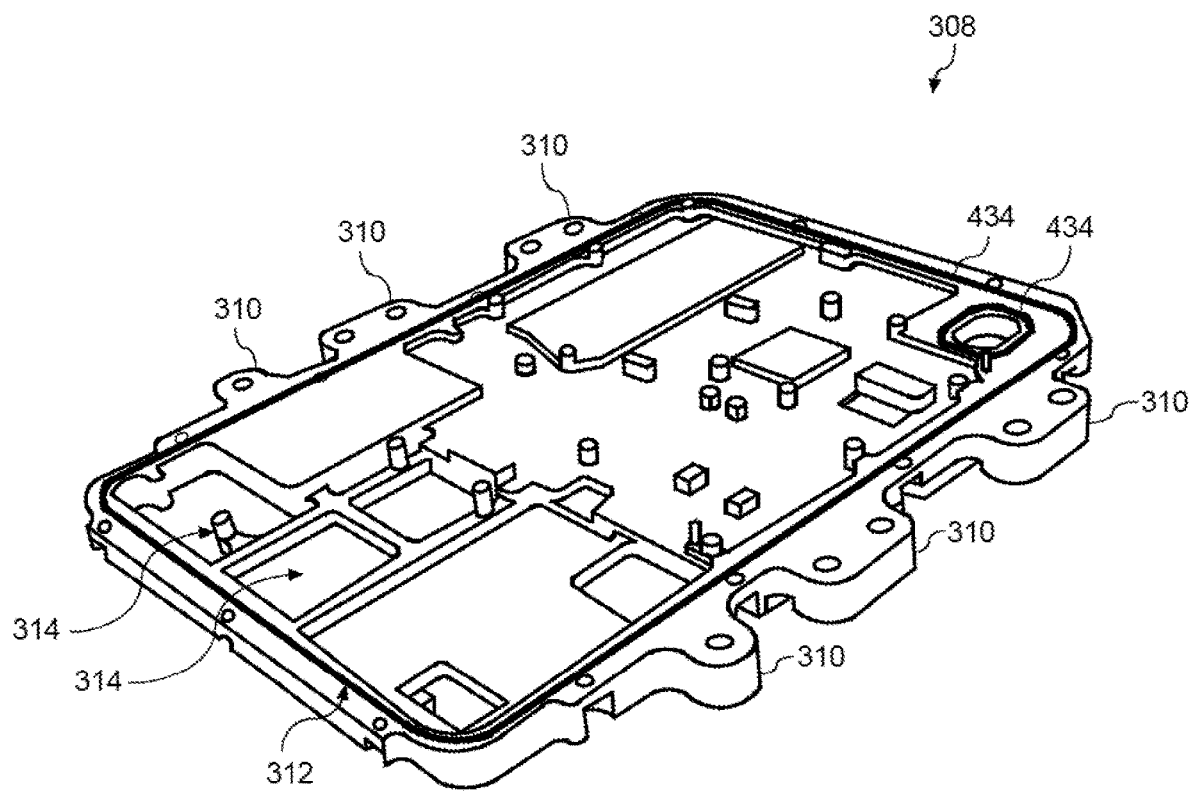
FIG. 16 depicts a first side of a cold plate of the LIDAR system of FIG. 15 according to some implementations of the present disclosure.

Referring now to FIGS. 15 and 16, the LIDAR system 300 is provided according to some implementations of the present disclosure. As shown, the first conduit 328 and the second conduit 330 can each be perpendicular to the cover 332. Furthermore, the interface 432 to facilitate brazing the conduits 328, 330 to the cover 332 can be a square portion included at an end of each of the conduits 328, 330.

As shown, the LIDAR system 300 can include a sealing member 434 disposed on the first side 312 of the cold plate 308. For instance, the sealing member 434 can extend around an outer portion of the first side 312 of the cold plate 308. The sealing member 434 can be configured to engage the lid 302 (FIG. 3) of the LIDAR system 300 to form a seal (e.g., non-hermetic) and enclose the one or more circuit modules 306 (FIG. 3) within the internal volume 304 (FIG. 5) defined by the lid 302. In some implementations, the sealing member 434 can include an O-ring. For instance, in some implementations, the O-ring can be formed from ethylene propylene diene monomer (EPDM) rubber.

Figure 5:
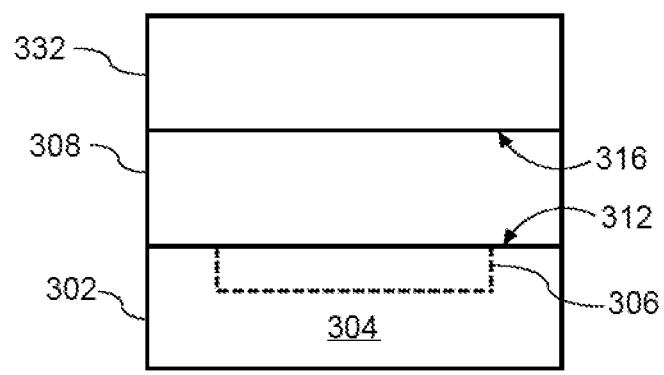
FIG. 5 depicts an arrangement of the cold plate of a LIDAR system relative to a lid of the LIDAR system and a cover of the LIDAR system according to some implementations of the present disclosure.
Figure 6:
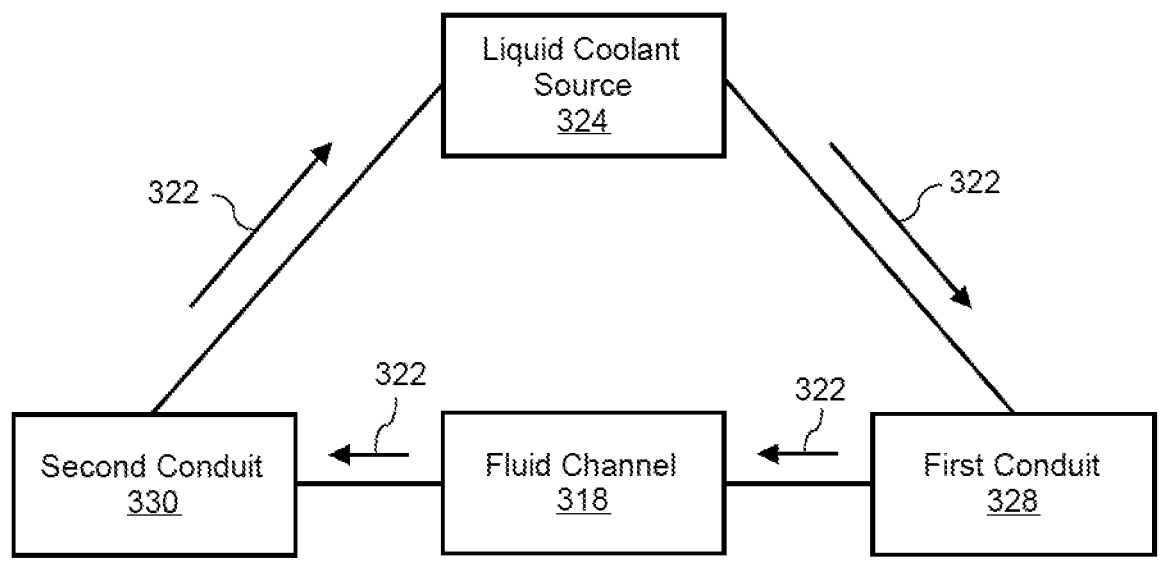
FIG. 6 depicts a flow path of a liquid coolant in a LIDAR system according to some implementations of the present disclosure.
Figure 7:
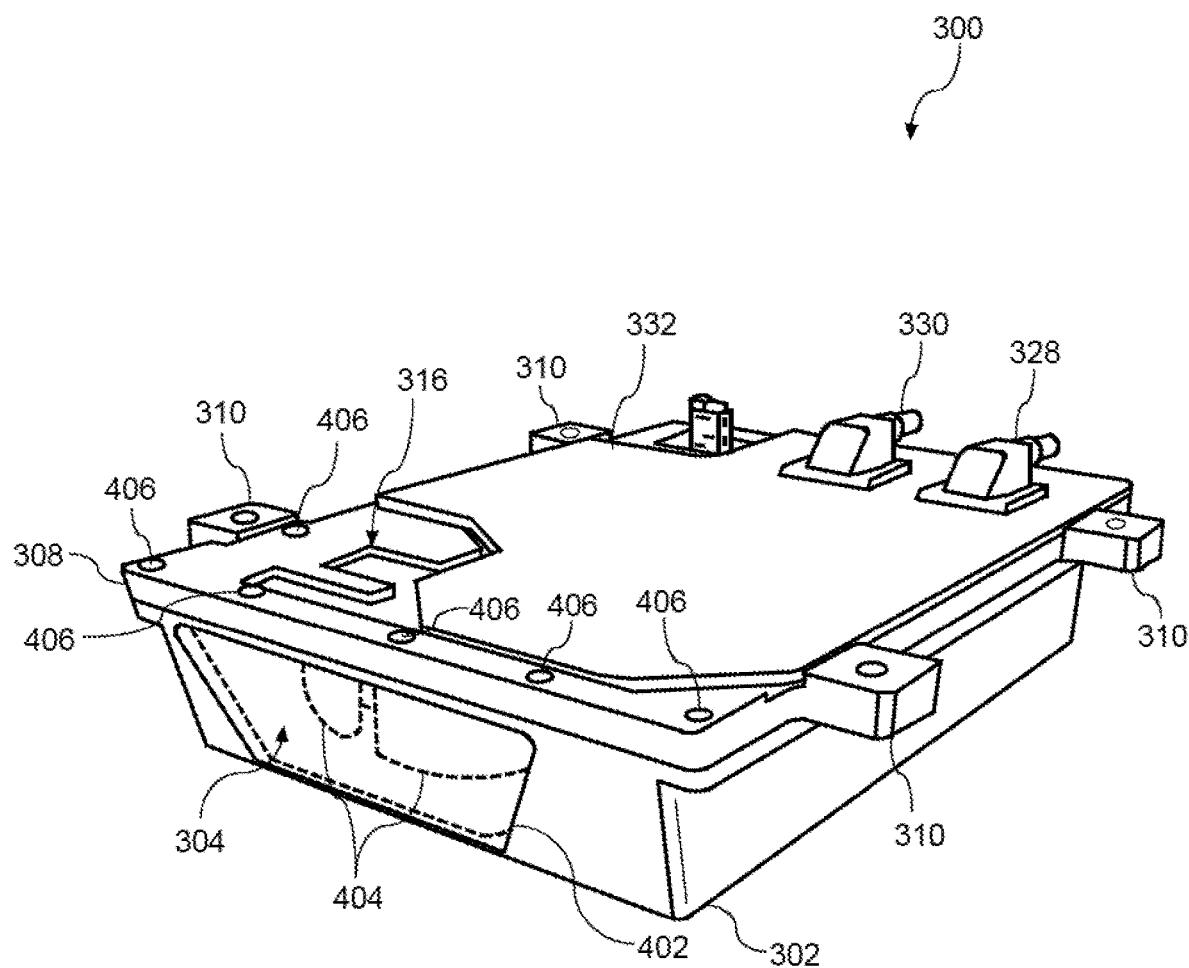
FIG. 7 depicts a LIDAR system according to some implementations of the present disclosure.
Figure 8:
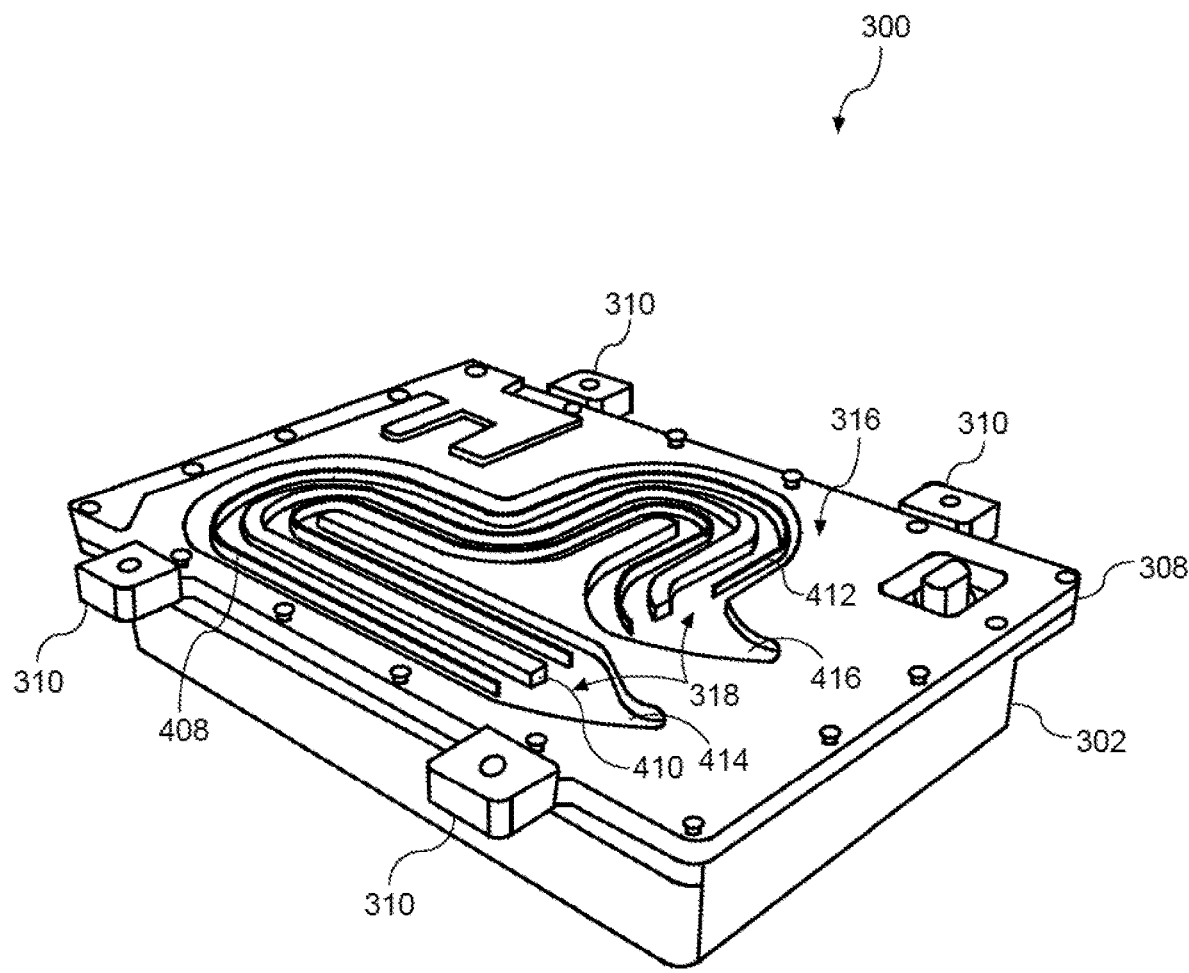
FIG. 8 depicts the LIDAR system of FIG. 7 with a cover of the LIDAR system removed according to some implementations of the present disclosure.
Figure 9:
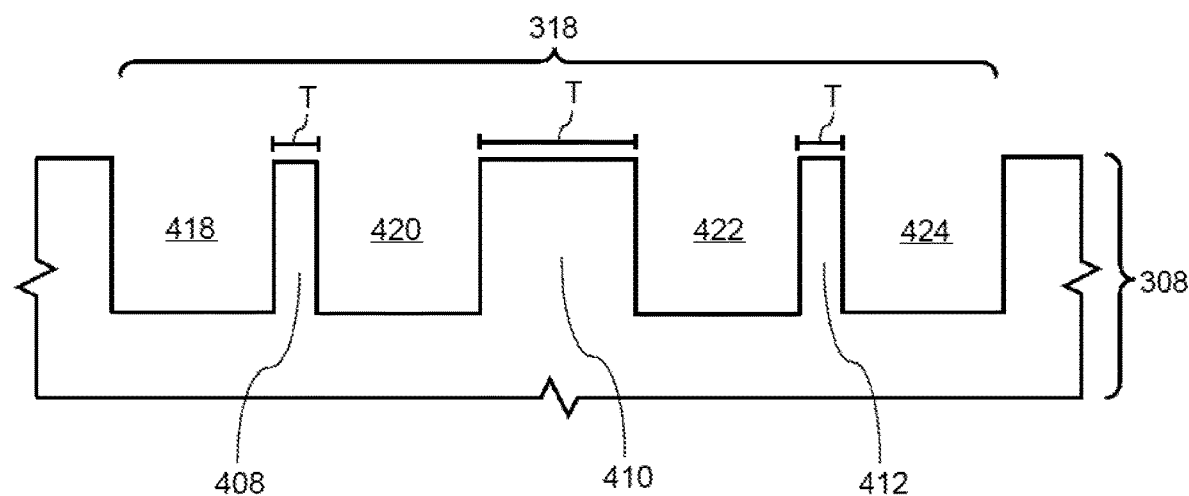
FIG. 9 depicts a fluid channel in a cold plate of the LIDAR system of FIG. 7 according to some implementations of the present disclosure.
Figure 10:
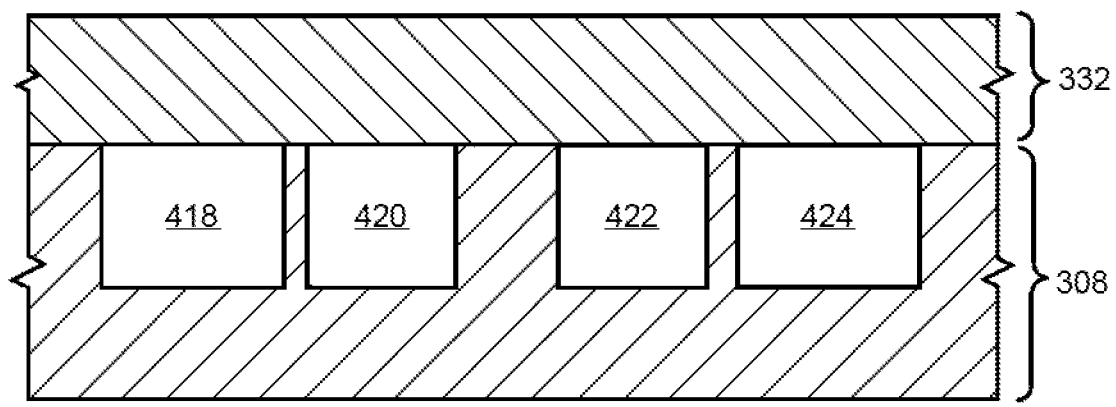
FIG. 10 depicts a cover of the LIDAR system of FIG. 7 positioned on a cold plate of the LIDAR system to cover a fluid channel in the cold plate according to some implementations of the present disclosure.

Furthermore, since the cold plate 308 is cooler than an ambient environment surrounding the cold plate 308, condensation can develop on the cold plate 308. In some implementations, the LIDAR system 300 can include a desiccant positioned within the internal volume 304 (FIG. 5) to regulate humidity levels within the internal volume 304. More particularly, the desiccant can keep humidity levels within the internal volume 304 low (e.g., above a dew point of the ambient environment) to prevent condensation from occurring within the internal volume 304 (FIG. 5) and negatively affecting the performance of one or more electronic components (e.g., optics, field programmable gate array, optical amplifiers, etc.) of the one or more circuit modules 306 (FIG. 5) enclosed within the internal volume 304 (FIG. 5) of the lid 302 (FIG. 5).

The following describes the technology of this disclosure within the context of an autonomous vehicle for example purposes only. As described herein, the technology described herein is not limited to an autonomous vehicle and can be implemented for or within other autonomous platforms and other computing systems.

What is claimed is:
1. A light detection and ranging (LIDAR) system for a vehicle, the LIDAR system comprising:
  a lid defining an internal volume;
  one or more circuit modules disposed within the internal volume;
  a cold plate including a heat treatable metal alloy, the cold plate further including:
    a first side coupled to the lid to enclose the one or more circuit modules within the internal volume defined by the lid, and
    a second side that is different from the first side and defines a fluid channel through which a liquid coolant flows; and
  a cover including a magnesium free metal alloy or a low magnesium content metal alloy, the cover being coupled to the cold plate to cover the fluid channel defined in the second side of the cold plate.

2. The LIDAR system of claim 1, wherein the second metal alloy includes the low magnesium content metal alloy, and the low magnesium content metal alloy includes a metal alloy that is less than 0.4% and more than 0.0% by weight magnesium.

3. The LIDAR system of claim 1, wherein the magnesium free metal alloy includes 3000 series aluminum and the low magnesium content metal alloy includes 1000 series aluminum.

4. The LIDAR system claim 1, wherein the heat treatable metal alloy includes a first aluminum alloy and the magnesium free metal alloy or the low magnesium content metal alloy includes a second aluminum alloy that is different from the first aluminum alloy.

5. The LIDAR system of claim 1, wherein the second side of the cold plate includes a plurality of ribs positioned within the fluid channel, the plurality of ribs dividing the fluid channel into at least a first fluid channel and a second fluid channel.

6. The LIDAR system of claim 1, wherein the cover is brazed to second side of the cold plate.

7. The LIDAR system of claim 5, wherein the plurality of ribs include a first rib having a first thickness and a second rib having a second thickness that is different than the first thickness.

8. The LIDAR system of claim 5, wherein the cover is brazed to at least one rib of the plurality of ribs.

9. The LIDAR system of claim 1, further comprising:
a first conduit fluidly coupled to an inlet of the fluid channel; and
a second conduit fluidly coupled to an outlet of the fluid channel.

10. The LIDAR system of claim 9, wherein at least one of the first conduit or the second conduit is substantially perpendicular to the cover.

11. The LIDAR system of claim 9, wherein the fluid channel includes a plurality of turns between the inlet of the fluid channel and the outlet of the fluid channel.

12. The LIDAR system of claim 9, wherein the first conduit and the second conduit are brazed to the cover.

13. The LIDAR system of claim 12, wherein:
the first conduit and the second conduit each include a first metal alloy.

14. The LIDAR system of claim 13, wherein the first metal alloy includes the heat treatable metal alloy.

15. The LIDAR system of claim 1, wherein the cold plate includes a plurality of mounts, each of the mounts configured to mount the cold plate to a roof of the vehicle.

16. The LIDAR system of claim 1, further comprising:
a sealing member disposed on the first side of the cold plate, the sealing member configured to engage with the lid to form a seal.

17. The LIDAR system of claim 16, wherein the sealing member includes an O-ring.

18. The LIDAR system of claim 1, wherein:
the one or more circuit modules include one or more circuit boards; and
the first side of the cold plate defines one or more recesses for the one or more circuit boards.

19. An autonomous vehicle control system comprising:
a LIDAR system including:
a lid defining an internal volume;
one or more circuit modules disposed within the internal volume;
a cold plate including a heat treatable metal alloy, the cold plate further including:
a first side coupled to the lid to enclose the one or more circuit modules within the internal volume defined by the lid, and
a second side that is different from the first side and defines a fluid channel through which a liquid coolant flows; and
a cover including a magnesium free metal alloy or a low magnesium content metal alloy, the cover being coupled to the cold plate to cover the fluid channel defined in the second side of the cold plate.

20. An autonomous vehicle comprising:
a LIDAR system including:
a lid defining an internal volume;
one or more circuit modules disposed within the internal volume;
a cold plate including a heat treatable metal alloy, the cold plate further including:
a first side coupled to the lid to enclose the one or more circuit modules within the internal volume defined by the lid, and
a second side that is different from the first side and defines a fluid channel through which a liquid coolant flows; and
a cover including a magnesium free metal alloy or a low magnesium content metal alloy, the cover being coupled to the cold plate to cover the fluid channel defined in the second side of the cold plate.

21. A light detection and ranging (LIDAR) system for a vehicle, the LIDAR system comprising:
a lid defining an internal volume;
one or more circuit modules disposed within the internal volume;
a cold plate including a first side coupled to the lid to enclose the one or more circuit modules within the internal volume defined by the lid, the cold plate further including a second side that is different from the first side and defines a fluid channel through which a liquid coolant flows;
a first conduit fluidly coupled to an inlet of the fluid channel;
a second conduit fluidly coupled to an outlet of the fluid channel; and
a cover coupled to the cold plate to cover the fluid channel defined in the second side of the cold plate,
wherein at least one of the first conduit and the second conduit includes a heat treatable metal alloy and the cover includes a magnesium free metal alloy or a low magnesium content metal alloy.

22. A light detection and ranging (LIDAR) system for a vehicle, the LIDAR system comprising:
a lid defining an internal volume;
one or more circuit modules disposed within the internal volume;
a cold plate including:
a first side coupled to the lid to enclose the one or more circuit modules within the internal volume defined by the lid,
a second side that is different from the first side and defines a fluid channel through which a liquid coolant flows, and
a plurality of mounts, each of the mounts configured to mount the cold plate to a roof of the vehicle; and a cover coupled to the cold plate to cover the fluid channel defined in the second side of the cold plate.

* * * * *